United States Patent
Iizuka et al.

(10) Patent No.: US 9,680,441 B2
(45) Date of Patent: Jun. 13, 2017

(54) IMPEDANCE MATCHING CIRCUIT AND ANTENNA SYSTEM

(71) Applicant: TAIYO YUDEN CO., LTD., Tokyo (JP)

(72) Inventors: Fumitaka Iizuka, Tokyo (JP); Kentaro Nakamura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 138 days.

(21) Appl. No.: 13/938,883

(22) Filed: Jul. 10, 2013

(65) Prior Publication Data
US 2014/0091980 A1     Apr. 3, 2014

(30) Foreign Application Priority Data
Sep. 28, 2012   (JP) .................. 2012-215469

(51) Int. Cl.
*H01Q 1/50*     (2006.01)
*H01Q 5/00*     (2015.01)
(Continued)

(52) U.S. Cl.
CPC ............. *H03H 7/38* (2013.01); *H01Q 1/50* (2013.01); *H01Q 5/314* (2015.01); *H03H 7/40* (2013.01)

(58) Field of Classification Search
CPC .......... H01Q 23/00; H01Q 5/30; H01Q 5/307; H01Q 5/314; H01Q 5/328; H01Q 5/335;
(Continued)

(56) References Cited

U.S. PATENT DOCUMENTS 6,453,157 B1 *   9/2002   Roberts .............. H03J 1/0008
                                                     333/176
6,882,245 B2 *   4/2005   Utsunomiya ........ H03H 7/0153
                                                     333/17.1
(Continued)

FOREIGN PATENT DOCUMENTS

JP      S59-4313 A      1/1984
JP      S60-174534 A    9/1985
(Continued)

OTHER PUBLICATIONS

Lou Frenzel, "Back to Basics: Impedance Matching (Part 1)", Oct. 24, 2011, Electronic Design, p. 3.*
(Continued)

*Primary Examiner* — Tho G Phan
*Assistant Examiner* — Patrick Holecek
(74) *Attorney, Agent, or Firm* — Chen Yoshimura LLP

(57) ABSTRACT

An impedance matching circuit is connected to a first circuit block (impedance matching target circuit) that requires impedance matching and that has one terminal connected to a signal line and the other terminal connected to a ground, the impedance matching circuit having a second circuit block that has a first circuit and a second circuit connected in parallel. In the first circuit, a first capacitor having a variable capacitance and a first inductor having a first inductance are connected in series, and in the second circuit, a second inductor having a second inductance and a switch are connected are connected in series. The impedance matching circuit has one terminal connected to the signal line of the first circuit block and the other terminal connected to the ground of the first circuit block.

5 Claims, 17 Drawing Sheets

(51) Int. Cl.
*H03H 7/38* (2006.01)
*H01Q 5/314* (2015.01)
*H03H 7/40* (2006.01)

(58) Field of Classification Search
CPC .......... H01Q 5/50; H01Q 1/50; H04B 1/0458;
H03H 7/38; H03H 7/40; H03H 7/1791;
H03H 7/0115
USPC ........................................ 343/850, 860, 861
See application file for complete search history.

(56) References Cited

U.S. PATENT DOCUMENTS

| | | | | |
|---|---|---|---|---|
| 7,057,472 | B2* | 6/2006 | Fukamachi | H03H 7/0115 333/101 |
| 7,088,307 | B2* | 8/2006 | Imaizumi | H03H 7/38 333/33 |
| 8,199,057 | B2* | 6/2012 | Ishizuka et al. | 343/700 MS |
| 8,368,483 | B2* | 2/2013 | Fukuda | H03H 7/38 333/124 |
| 8,754,826 | B2* | 6/2014 | Ozone | H01Q 1/521 343/861 |
| 2003/0060227 | A1 | 3/2003 | Sekine et al. | |
| 2004/0217915 | A1 | 11/2004 | Imaizumi | |
| 2004/0251985 | A1 | 12/2004 | Guitton et al. | |
| 2008/0238569 | A1 | 10/2008 | Matsuo | |
| 2010/0194487 | A1 | 8/2010 | Fukuda et al. | |
| 2010/0259452 | A1* | 10/2010 | Kondo | H01Q 1/244 343/702 |
| 2011/0116404 | A1 | 5/2011 | Shimizu | |
| 2012/0087282 | A1 | 4/2012 | Shibahara | |
| 2013/0069737 | A1* | 3/2013 | See et al. | 333/32 |

FOREIGN PATENT DOCUMENTS

| | | |
|---|---|---|
| JP | H9-55633 A | 2/1997 |
| JP | H09-74325 A | 3/1997 |
| JP | 2003-174367 A | 6/2003 |
| JP | 2004-312741 A | 11/2004 |
| JP | 2004-336250 A | 11/2004 |
| JP | 2005-311762 A | 11/2005 |
| JP | 2006-180047 A | 7/2006 |
| JP | 2008-306428 A | 12/2008 |
| JP | 2010-200310 A | 9/2010 |
| JP | 2011-109440 A | 6/2011 |
| WO | 2011/001769 A1 | 1/2011 |

OTHER PUBLICATIONS

Japanese Office Action dated Jul. 16, 2014, in a counterpart Japanese patent application No. 2012-215469.

* cited by examiner

IMPEDANCE MATCHING CIRCUIT AND ANTENNA SYSTEM

This application claims the benefit of Japanese Application No. 2012-215469, filed in Japan on Sep. 28, 2012, which is hereby incorporated by reference in its entirety.

BACKGROUND OF THE INVENTION

Field of the Invention

The present invention relates to an impedance matching circuit that is suitably connected to an antenna of portable wireless devices and the like, for example, that require impedance matching, and to an antenna system.

Description of Related Art

In electronic devices that conduct wireless communication such as mobile phones, as disclosed in Patent Documents 1, 2, and 3, for example, an impedance matching circuit is disposed between an antenna and a transmission/reception circuit. By providing the impedance matching circuit, the impedance of the antenna side is set so as to match with the impedance of the transmission/reception circuit side, and typically, the impedance is set to approximately 50Ω.

Patent Document 1 discloses an impedance matching circuit that is generally used in wireless devices and the like. FIG. 3 of Patent Document 1 shows an example of a Π-type impedance matching circuit in which an inductor is connected in series between an antenna and a transmission/reception circuit, and capacitors are connected in parallel to the front and the rear of the inductor. The capacitors are also connected to a ground.

When mobile phones are in use, an antenna thereof is placed near human body or other mobile devices, and therefore, unlike when the mobile phone is placed in a free space, the antenna impedance changes, which causes impedance mismatch with the transmission/reception circuit, and as a result, the antenna characteristics change. The change in antenna characteristics means a reduction in antenna efficiency, and is caused by a change in reflection coefficient or gain deterioration. A change in reflection coefficient causes not only the antenna characteristics to change, but also the passband loss in the transmission/reception bands to increase significantly. Therefore, the mismatch caused by a surrounding environment such as human body needs to be compensated by an impedance matching circuit, to suppress the deterioration of the antenna characteristics.

However, the mismatch of the antenna impedance that has been changed by the surrounding environment such as human body is too large to be addressed by a circuit that combines elements with fixed values. Therefore, in order to flexibly address the impedance change and achieve impedance matching, a method is employed in which a capacitance of each element included in the impedance matching circuit is made variable. For the frequencies that are commercially used for mobile phones, there is no usable variable inductor, and therefore, as disclosed in FIG. 1 of Patent Document 1, variable capacitors such as varactor diodes are used.

It is known that the degree of impedance mismatch can be quantified by VSWR (voltage standing wave ratio). Specifically, when VSWR is 1, the reflection coefficient becomes 0, which represents perfect matching, and as the degree of mismatch increases, VSWR becomes greater than 1. If the frequency at which VSWR is at a minimum is shifted due to a surrounding environment such as human body, then VSWR deteriorates. Thus, according to the impedance matching circuit shown in FIG. 1 of Patent Document 1, values of elements that constitute the circuit can be adjusted such that VSWR is at a minimum in a desired frequency.

Currently, a usable variable inductor that is small and has a low loss (high Q), which can be provided in mobile wireless devices, is not yet available, and therefore, a study is conducted on an impedance matching circuit that uses variable capacitors instead. FIG. 1 of Patent Document 2 discloses an impedance matching circuit that includes three variable capacitors. With the technique disclosed in Patent Document 2, if the variable ratio of the variable capacitance can be made 20 to 200 or greater, then it is possible to realize a circuit that is capable of impedance matching regardless of a region on the Smith chart to which the antenna impedance has been moved as a result of the impedance change. Being able to cover a large region on the Smith chart means that the circuit is not affected by a shape and characteristics of an antenna, or in other words, it is possible to realize a versatile impedance matching circuit that can be used for any antenna.

However, the variable ratio that can be achieved by variable capacitors that are currently available such as variable capacitance diodes, RF-CMOS, and ferroelectric varactor diodes is 10 or less, and when the variable ratio is 10 or less, the region that can be covered on the Smith chart is made smaller. Furthermore, if the control voltage for the variable capacitors such as variable capacitance diodes and ferroelectric varactor diodes is reduced, the variable ratio is further reduced to 3 or less, for example. Thus, Patent Document 3 proposes a circuit that can change the reactance and susceptance indefinitely by using variable capacitors that have definite variable range, for example.

RELATED ART DOCUMENTS

Patent Documents

Patent Document 1: Japanese Patent Application Laid-Open Publication No. S59-4313
Patent Document 2: Japanese Patent Application Laid-Open Publication No. 2008-306428
Patent Document 3: Japanese Patent Application Laid-Open Publication No. H9-74325

SUMMARY OF THE INVENTION

However, the technology disclosed in Patent Document 3 only describes characteristics of ideal elements, and parasitic resistance components that always exist in capacitors and inductors are not taken into consideration. That is, the admittance $Y_1$ of an impedance matching circuit 30 shown in FIG. 13 (FIG. 1 of Patent Document 3) that can change the reactance and susceptance indefinitely by using variable capacitors that have definite variable range is given by Formula 1 below.

Formula 1

$$Y_1 = G_1 + jB_1 = 0 + j\omega C_v \left( \frac{1}{1 - \omega^2 C_v L_1} + \frac{1}{1 - \omega^2 C_v L_2} \right) \quad (1)$$

Thus, with respect to the variable capacitance $C_v$ that changes between $C_{min}$ and $C_{max}$ (where $C_v$ is a capacitance of the variable capacitor, $C_{min}$ is the minimum value of the capacitance, and $C_{max}$ is the maximum value of the capacitance), inductances $L_1$ and $L_2$ of the inductors are set so as to fulfill $L_1=1/(\omega^2 C_{max})$, and $L_2=1/(\omega^2 C_{min})$, where $\omega$ is angular frequency. When this circuit is connected between a signal line and a ground of a circuit block that requires impedance matching, and when the capacitances $C_v$ of the two variable capacitors are changed at the same time, as shown in the characteristics diagram of FIG. 14 (graph representing the conductance $G_1$ and the susceptance $B_1$ with respect to the capacitance $C_v$), for example, the susceptance $B_1$ can be changed indefinitely with the conductance $G_1$ remaining zero. This makes it possible to conduct impedance matching without causing a loss due to resistance.

However, when an attempt is made to realize the matching circuit shown in FIG. 13 using actual inductors and capacitors, because each element always has a parasitic resistance component, the circuit operates as shown with an equivalent circuit of FIG. 15, for example. In FIG. 15, $R_1$ and $R_2$ respectively represent a sum of parasitic resistance in the inductors and in the variable capacitors. In this case, the admittance $Y_2$ of the impedance matching circuit 30 of FIG. 13 is given by Formula 2 below.

Formula 2

$$Y_2 = G_2 + jB_2 = \left[\frac{R_2}{\left(\frac{1}{\omega C_v} - \omega L_1\right)^2 + R_1^2} + \frac{R_2}{\left(\frac{1}{\omega C_v} - \omega L_2\right)^2 + R_2^2}\right] + \qquad(2)$$

$$j\left[\frac{\frac{1}{\omega C_v} - \omega L_1}{\left(\frac{1}{\omega C_v} - \omega L_1\right)^2 + R_1^2} + \frac{\frac{1}{\omega C_v} - \omega L_2}{\left(\frac{1}{\omega C_v} - \omega L_2\right)^2 + R_2^2}\right]$$

Thus, as shown in the characteristics diagram of FIG. 16, for example, the susceptance $B_2$ does no longer vary indefinitely within the variable range of the variable capacitors, and reaches the maximum value at $C_v=1/[\omega(\omega L_1+R_1)]$ and the minimum value at $C_v=1/[\omega(\omega L_2-R_2)]$. Instead, the conductance $G_2$ becomes significantly large near $C_{min}$ and $C_{max}$. Because the conductance $G_2$ is a sum of the component that reaches the maximum value of $1/R_2$ at $C_{min}$ and that attenuates as it moves away from $C_{min}$, and the component that reaches the minimum value of $1/R_1$ at $C_{max}$ and that attenuates as it moves away from $C_{max}$, a difference between $C_{min}$ and $C_{max}$ is small. In other words, as the variable ratio is smaller, the conductance $G_2$ becomes larger over the entire region of the capacitance variable range, and the resistance component between the signal line and the ground becomes smaller. Although the susceptance value is reduced significantly, the size of change is still large as compared with a configuration only with variable capacitors, and therefore, this configuration can make it easier to achieve the impedance matching. However, if a small resistance exists between the signal line and the ground, more signals flow toward the ground from the small resistance, causing the signal transmission efficiency to be lowered.

Furthermore, from the setting conditions of $L_1$ and $L_2$, the lower the frequency is, the larger inductance is required, which increases the conductor length in the inductor. As a result, the parasitic resistance increases more significantly, causing deterioration in characteristics.

The present invention was made to solve the above-mentioned problems, and an object thereof is to provide an impedance matching circuit and an antenna system that can address a wide range of impedance change by using variable capacitors that has a smaller variable ratio while suppressing deterioration in characteristics due to a parasitic resistance.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, a first aspect of the present invention provides an impedance matching circuit connected to a first circuit block that requires impedance matching and that has one terminal connected to a signal line and another terminal connected to a ground, the impedance matching circuit including a second circuit block having a first circuit and a second circuit connected in parallel, the first circuit including a first capacitor having a variable capacitance and a first inductor having a first inductance connected in series, the second circuit including a second inductor having a second inductance and a switch connected in series, wherein one terminal of the impedance matching circuit is connected to the signal line of the first circuit block, and another terminal of the impedance matching circuit is connected to the ground of the first circuit block.

In the present invention, the impedance matching circuit further includes a control part that determines whether an input impedance of the first circuit block is inductive or capacitive and that turns the switch off when the input impedance is inductive and turns the switch on when the input impedance is capacitive, the control part controlling a voltage applied between the first inductor and the first capacitor.

In the present invention, the impedance matching circuit further includes a third inductor that has a different inductance from that of the second inductor and that is connected to the second inductor in parallel, wherein the control part controls the switch to change an inductor to be connected to the first circuit from one of the second inductor and the third inductor to another.

A second aspect of the present invention provides an antenna system that includes: an antenna; an impedance matching circuit disposed near the antenna and connected between a signal line and a ground of the antenna, the impedance matching circuit having a first circuit and a second circuit connected in parallel, the first circuit including a first capacitor having a variable capacitance and a first inductor having a first inductance connected in series, the second circuit including a second inductor having a second inductance and a switch connected in series; and a control part that determines whether an input impedance of the antenna is inductive or capacitive and that turns the switch off when the input impedance is inductive and turns the switch on when the input impedance is capacitive, the control part controlling a voltage applied between the first inductor and the first capacitor.

Effects of the Invention

According to the present invention, it is possible to provide an impedance matching circuit and an antenna system that can address a wide range of impedance change by using variable capacitors that has a smaller variable ratio while suppressing deterioration in characteristics due to a parasitic resistance.

DETAILED DESCRIPTION OF THE PREFERRED EMBODIMENTS

Configurations of Embodiments

Below, embodiments of the present invention (will be simply referred to as the present embodiment below) will be explained in detail with reference to appended drawings.

Figure 1:
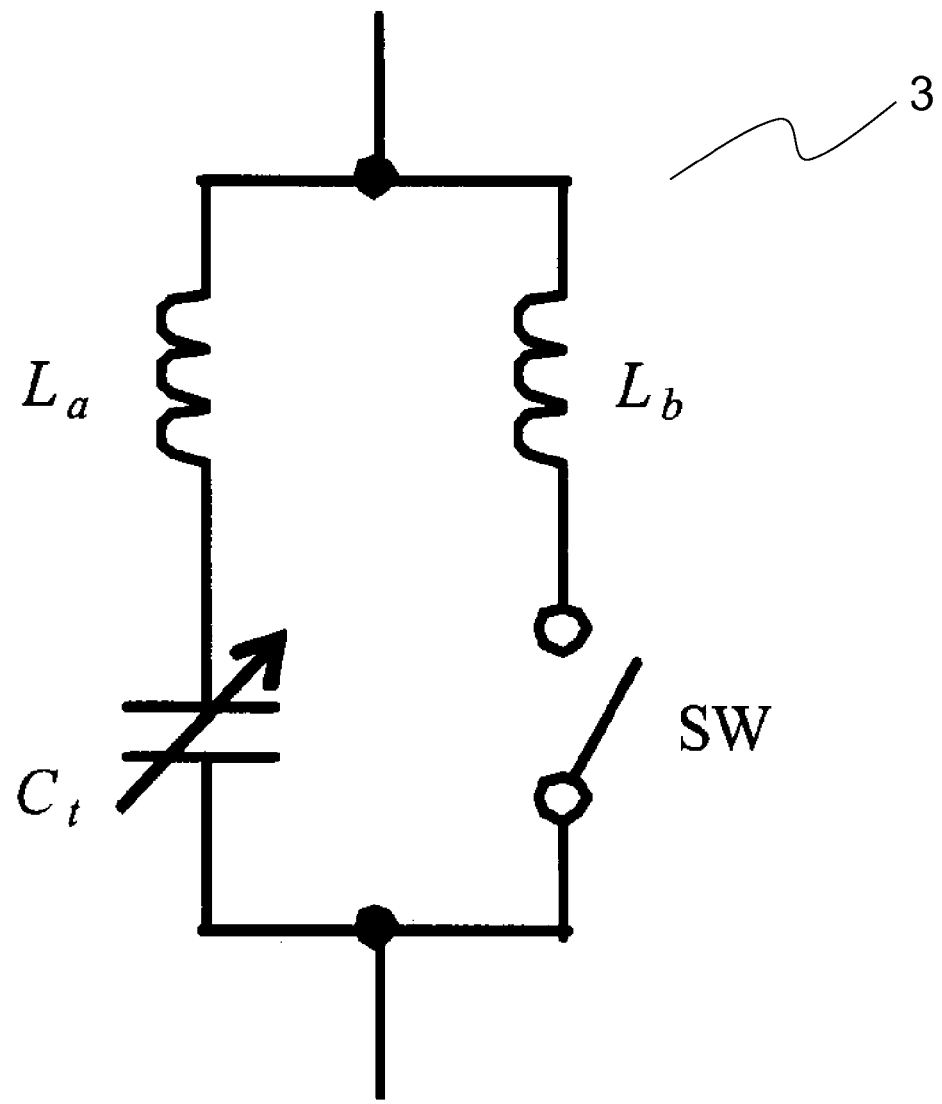
FIG. 1 is a diagram showing a circuit configuration of an impedance matching circuit of an embodiment of the present invention.
Figure 13:
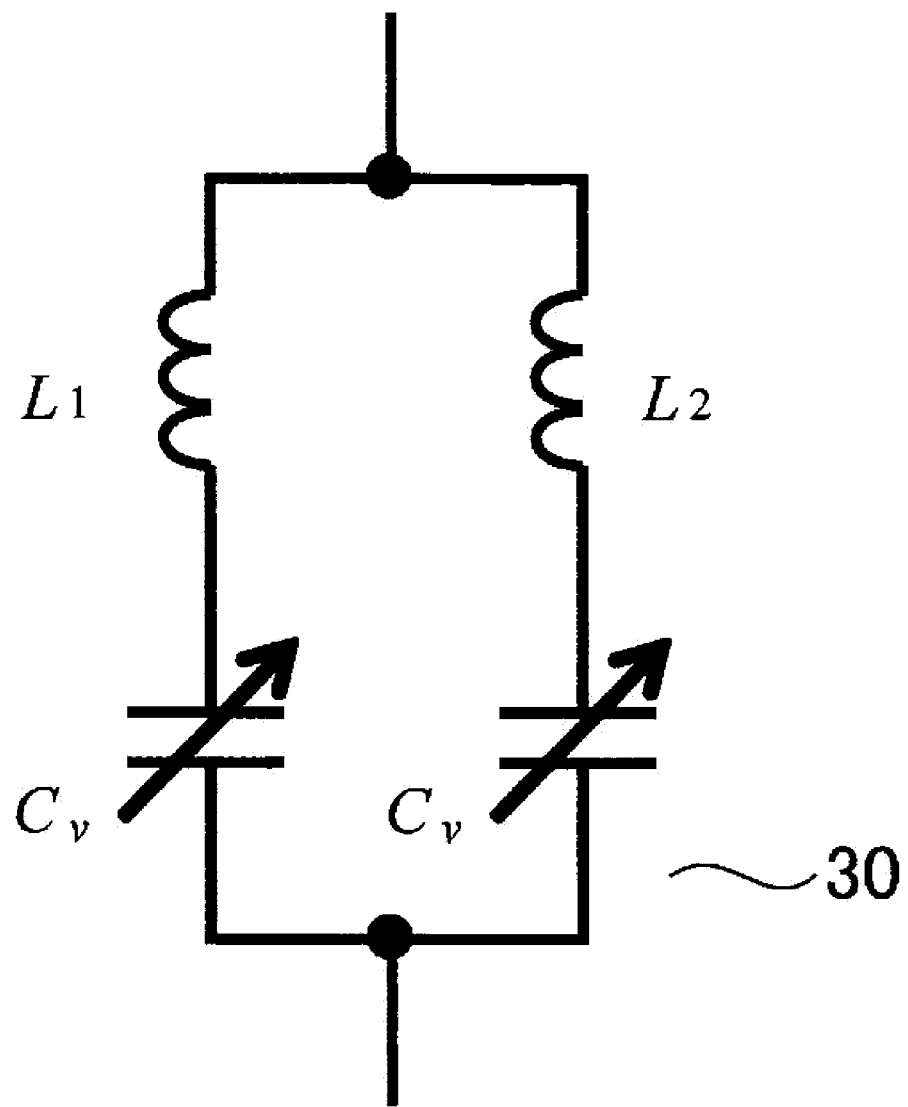
FIG. 13 is a diagram showing an example of a conventional impedance matching circuit.
Figure 14:
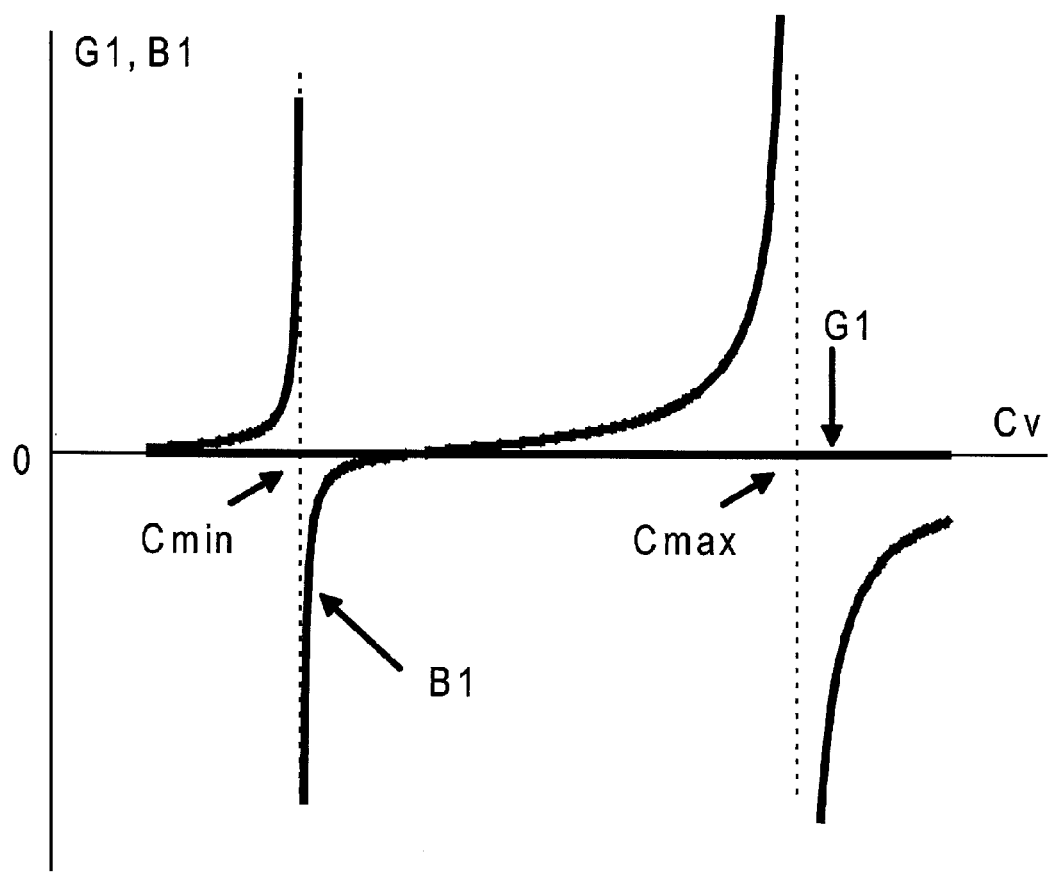
FIG. 14 is a diagram showing ideal characteristics of conductance and susceptance with respect to capacitance of the variable capacitor of FIG. 13.
Figure 15:
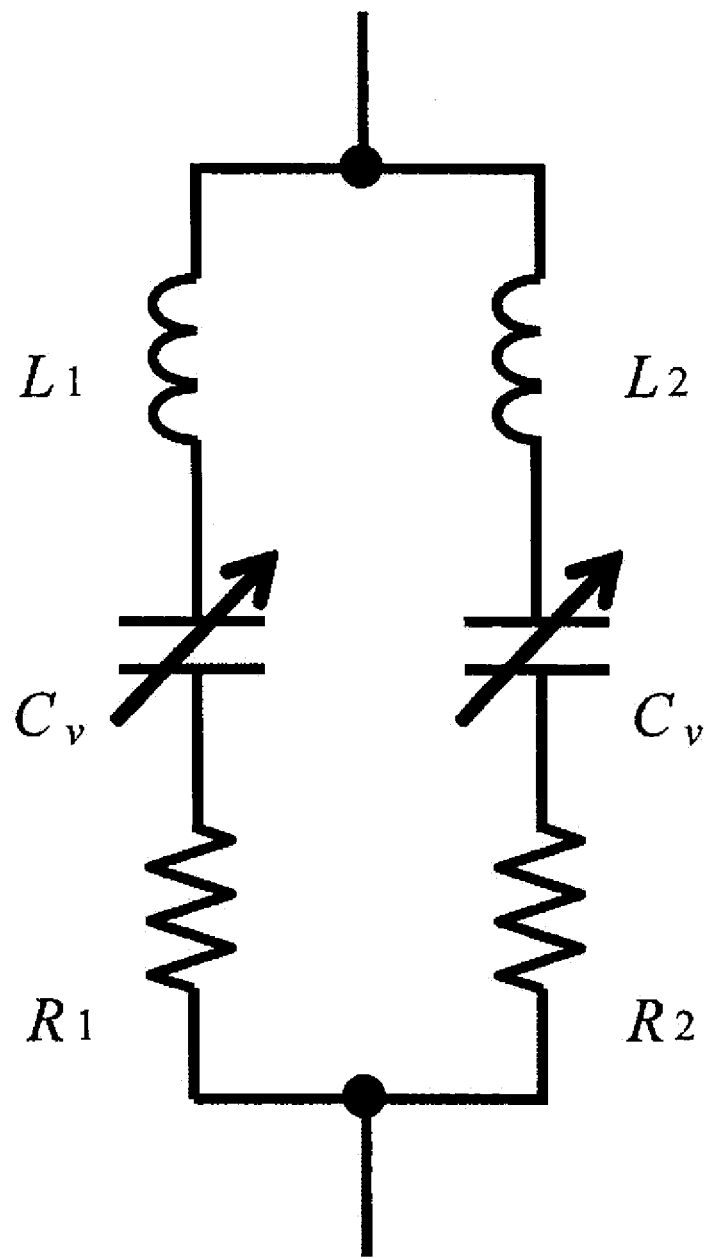
FIG. 15 is a diagram showing an equivalent circuit of the impedance matching circuit of FIG. 13.
Figure 16:
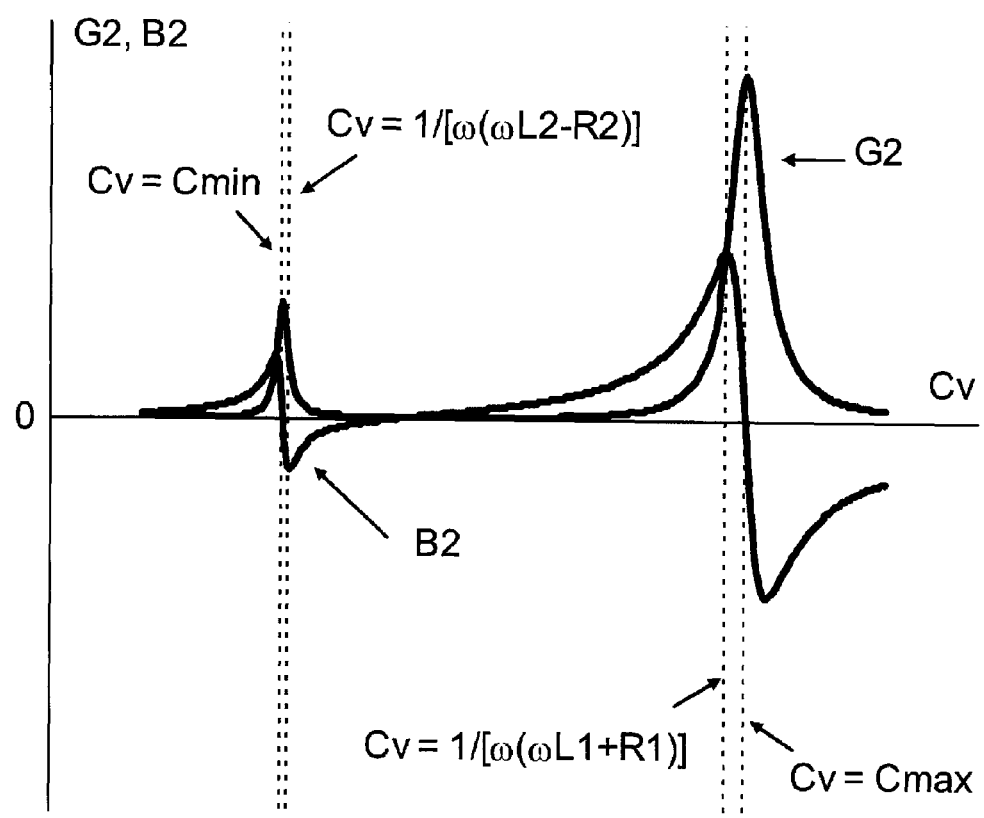
FIG. 16 is a diagram showing characteristics of conductance and susceptance with respect to capacitance of the variable capacitor of FIG. 15.

FIG. 1 is a diagram showing a circuit configuration of an impedance matching circuit 3 of the present embodiment. This impedance matching circuit 3 differs from a conventional impedance matching circuit 30 shown in FIG. 13 in that a switch SW is connected in series with one inductor, instead of a variable capacitor.

That is, as shown in FIG. 1, the impedance matching circuit 3 of the present embodiment includes a circuit block (second circuit block) in which a first circuit and a second circuit are connected in parallel. In the first circuit, a first capacitor $C_t$ that has a variable capacitance $C_{t0}$ that varies in a range of $C_{min} < C_{t0} < C_{max}$ and a first inductor $L_a$ that has a first inductance $L_{a0}$ are connected in series, and in the second circuit, a second inductor $L_b$ that has a second inductance $L_{b0}$ and a switch SW are connected in series. As described below, the impedance matching circuit 3 is connected to an impedance matching target circuit (first circuit block) that requires impedance matching and that has one terminal connected to a signal line and the other terminal connected to a ground.

Figure 17A:
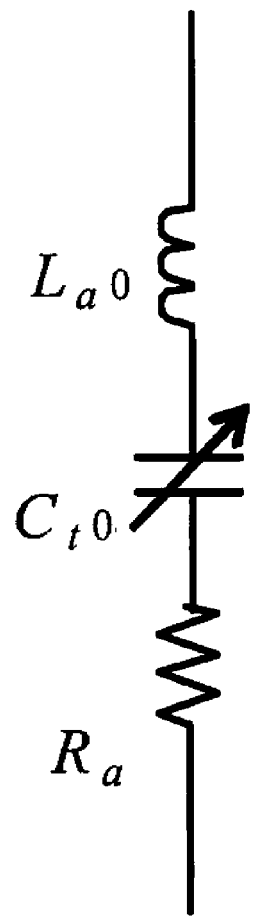
FIGS. 17A and 17B are diagrams each showing an equivalent circuit of the impedance matching circuit of FIG. 1.
Figure 17B:
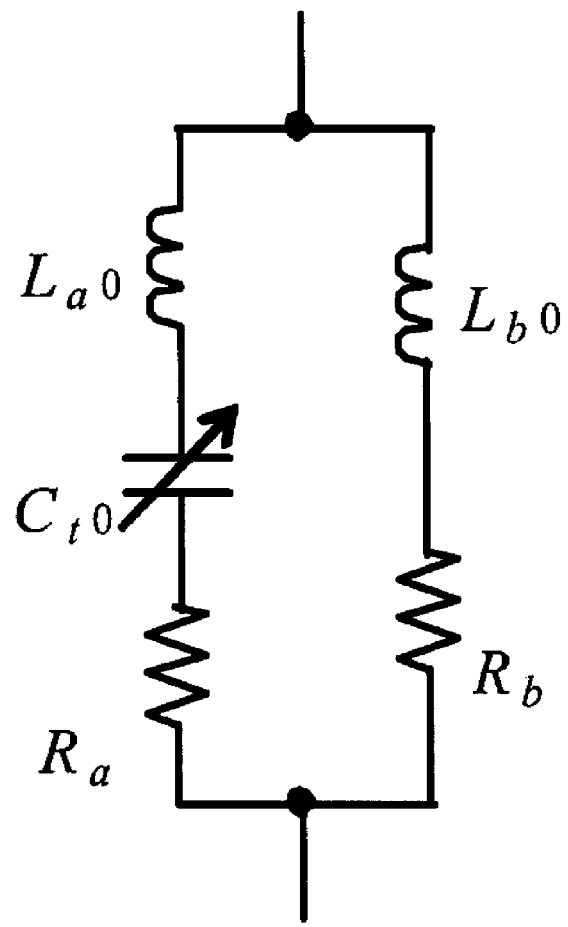

With the above-mentioned configuration, the matching circuit operates as shown with equivalent circuits of FIGS. 17A and 17B, for example, taking into consideration parasitic resistances. In FIGS. 17A and 17B, by setting the first inductance $L_{a0}$ such that $1/[\omega(\omega L_{a0}+R_a)]$ is smaller than the maximum capacitance $C_{max}$ of the variable capacitor, or in other words, by setting $L_{a0}$ to be smaller than $(1/(\omega C_{max})-R_a)/\omega$, the significant increase in conductance due to a parasitic resistance can be suppressed. $R_a$ is a sum of the parasitic resistance value of the inductor $L_a$ and the parasitic resistance value of the variable capacitor $C_t$ in the first circuit. Here, $L_{a0}$ can be made smaller than $L_1 = 1/(\omega^2 C_{max})$ in the conventional technology, and because the conductor length in the inductor can be made shorter, if the inductor has the same Q value, the parasitic capacitance can also be made smaller.

On the other hand, the second inductor $L_b$ has a function of making the susceptance shifted to the negative side when the switch SW is off, and the smaller the inductance $L_{b0}$, the more the susceptance can be shifted. Thus, it is possible to change the susceptance region without increasing the conductance. When the switch SW is off, the admittance $Y_3$ of the impedance matching circuit 3 shown in FIG. 1 operates as shown in FIG. 17A, and is given by Formula 3 below.

Formula 3

$$Y_3 = G_3 + jB_3 = \frac{R_a}{\left(\frac{1}{\omega C_{t0}} - \omega L_{a0}\right)^2 + R_a^2} + j\frac{\frac{1}{\omega C_{t0}} - \omega L_{a0}}{\left(\frac{1}{\omega C_{t0}} - \omega L_{a0}\right)^2 + R_a^2} \quad (3)$$

On the other hand, the admittance $Y_4$ when the switch SW is on operates as shown in FIG. 17B, and is given by formula 4 below. $R_b$ is a sum of the parasitic resistance value of the inductor and the parasitic resistance value of the switch SW in the second circuit.

Formula 4

$$Y_4 = G_4 + jB_4 = \left[\frac{R_a}{\left(\frac{1}{\omega C_{t0}} - \omega L_{a0}\right)^2 + R_a^2} + \frac{R_b}{(\omega L_{b0})^2 + R_b^2}\right] + \quad (4)$$

$$j\left[\frac{\frac{1}{\omega C_{t0}} - \omega L_{a0}}{\left(\frac{1}{\omega C_{t0}} - \omega L_{a0}\right)^2 + R_a^2} + \frac{\omega L_{b0}}{(\omega L_{b0})^2 + R_{b0}^2}\right]$$

Figure 2:
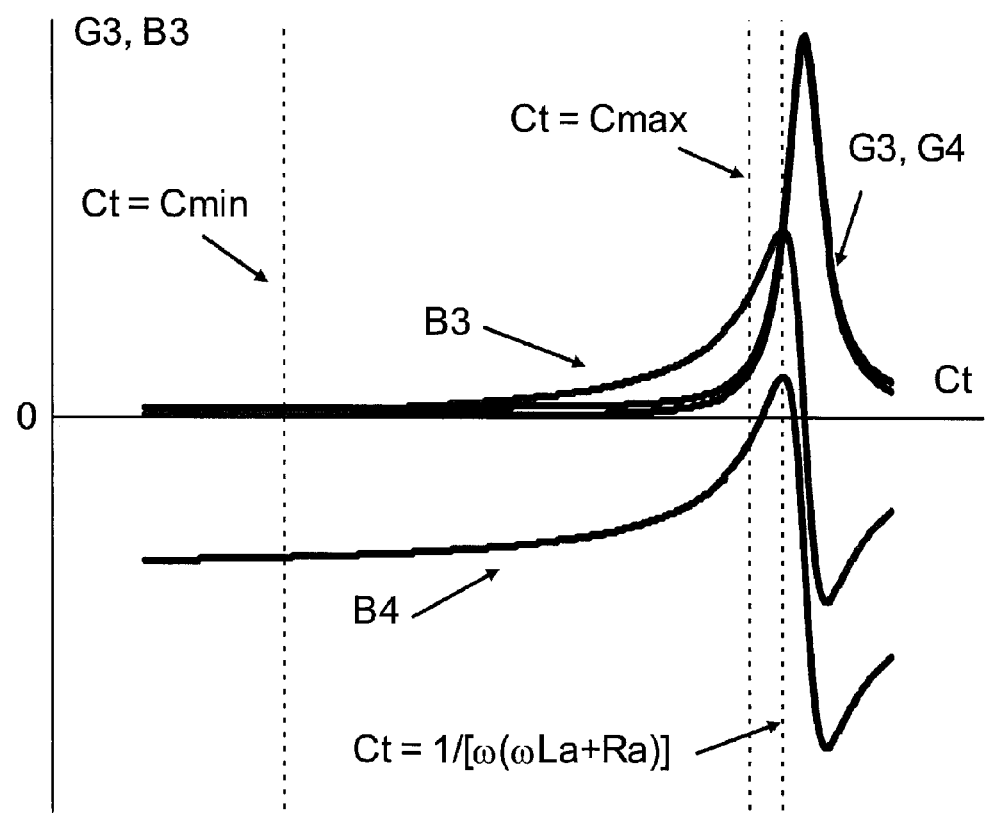
FIG. 2 is a diagram showing characteristics of conductance and susceptance with respect to capacitance of the variable capacitor of FIG. 1.

FIG. 2 shows characteristics of the conductance and susceptance with respect to the capacitance $C_{t0}$ of the variable capacitor. $G_3$ and $B_3$ are conductance and susceptance when the switch SW is off, and $B_4$ and $G_4$ are conductance and susceptance when the switch SW is on, respectively. As shown in the characteristics diagram, it is possible to prevent an increase in conductance while maintaining a large variable range of the susceptance by turning on and off the switch SW, in the variable range of $C_{t0}$. By using the impedance matching circuit 3, when the impedance matching target circuit is inductive, the switch SW is turned off, thereby increasing the capacitance, and when the impedance matching target circuit is capacitive, the switch SW is turned on, thereby decreasing the capacitance.

Performance Evaluation of Embodiments

Figure 3:
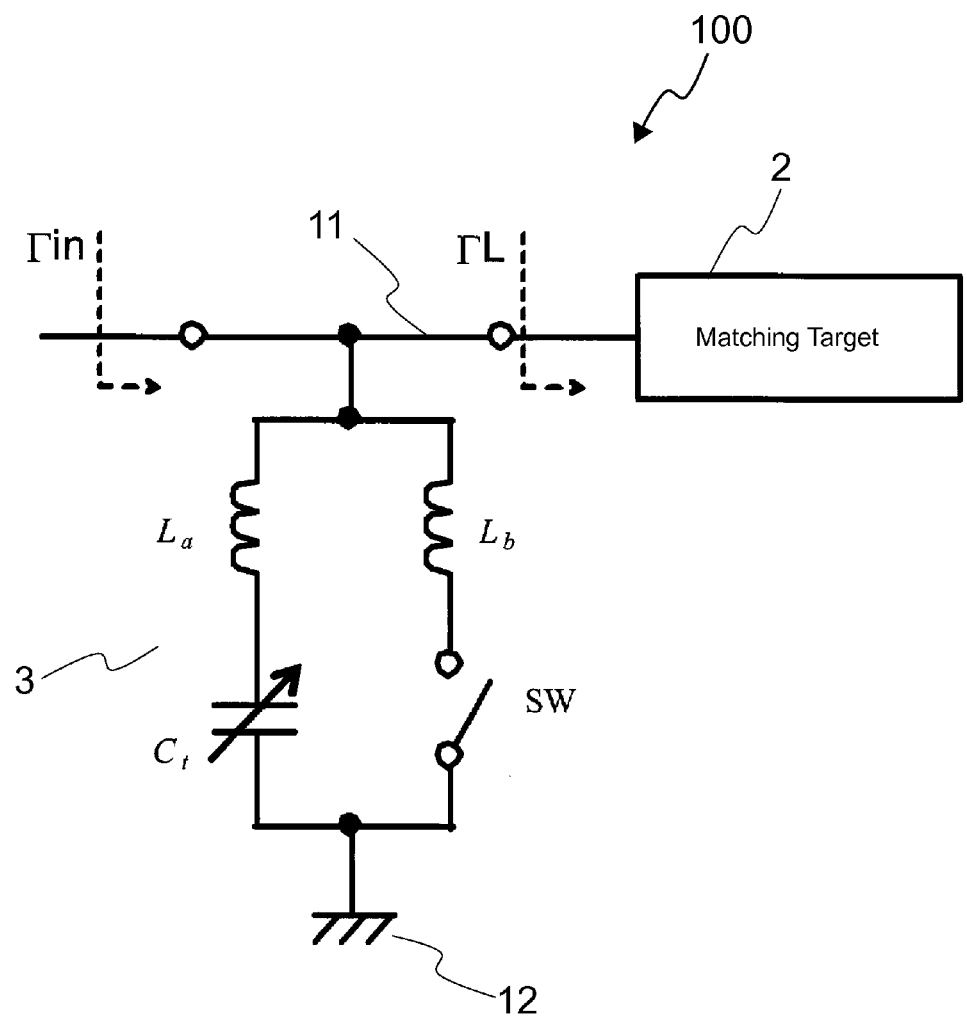
FIG. 3 is an impedance matching circuit that uses the characteristics shown in FIG. 2.
Figure 4:
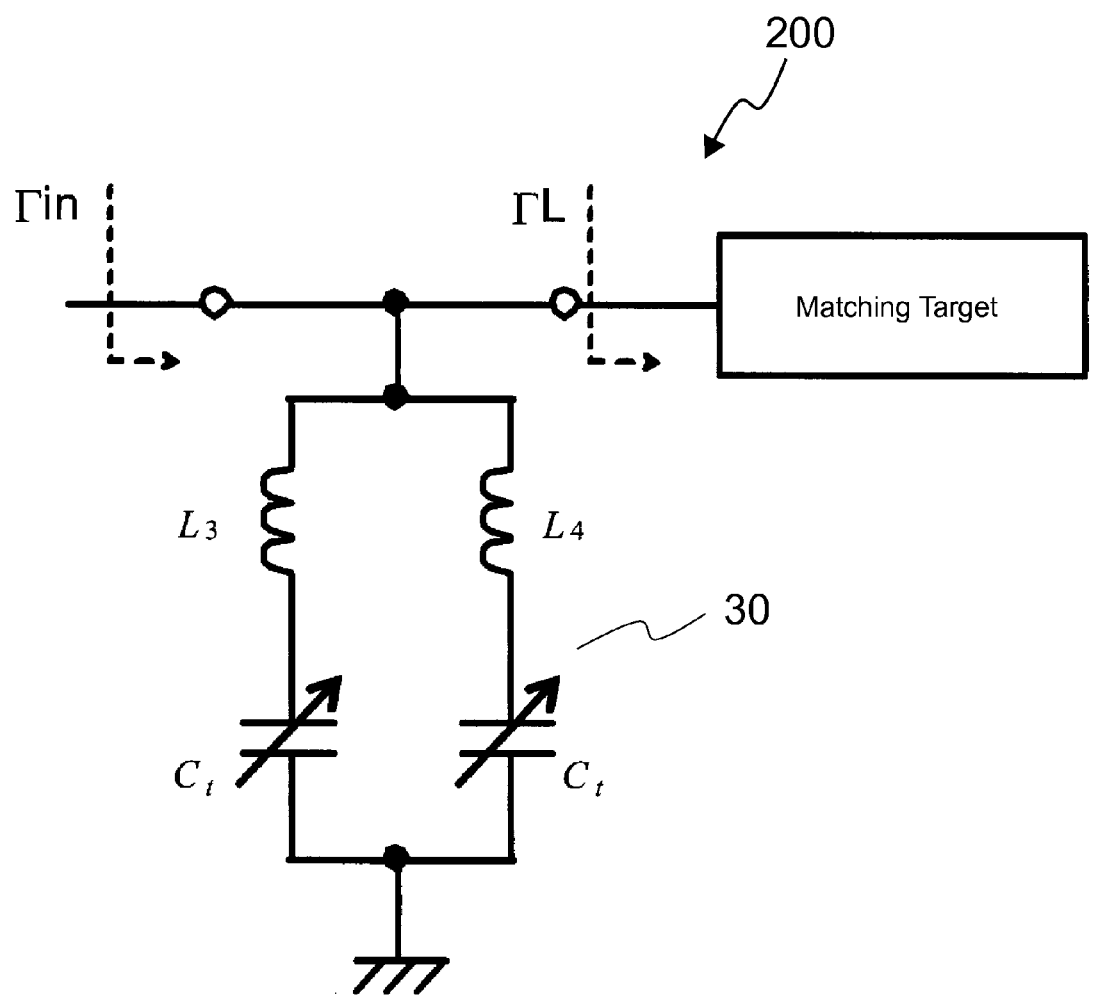
FIG. 4 is an impedance matching circuit as a comparison example that uses the characteristics of FIG. 14.

The performance evaluation results of the impedance matching circuit 3 of the present embodiment will be explained. FIG. 3 shows an evaluation circuit 100 in which the impedance matching circuit 3 of the present embodiment is connected between a signal line 11 and a ground 12 of the impedance matching target circuit 2 that requires impedance matching, and FIG. 4 shows a comparison circuit 200 in which a conventional impedance matching circuit 30 (FIG. 13) is connected.

Both of the evaluation circuit 100 (FIG. 3) and the comparison circuit 200 (FIG. 4) use the capacitor $C_t$ having a variable capacitance with $C_{min}$ being 1.5 (pF) and $C_{max}$ being 3.0 (pF) (variable ratio=2). To fulfill the conditions of $C_{min}$ and $C_{max}$ at the frequency of 800 (MHz), the comparison circuit 200 is provided with an inductor $L_3$ that has an inductance of 13.1 (nH) and an inductor $L_4$ that has an inductance of 26.4 (nH), and the evaluation circuit 100 is provided with an inductor $L_a$ that has an inductance of 7 (nH) and an inductor $L_b$ that has an inductance of 4.5 (nH). The inductance of $L_a$ can be smaller than the inductance of $L_3$, and the inductance of $L_b$ is appropriately set as needed. The Q value of each inductor is set to Q=35, and the insertion loss of SW is 0.1 dB.

Figure 5A:
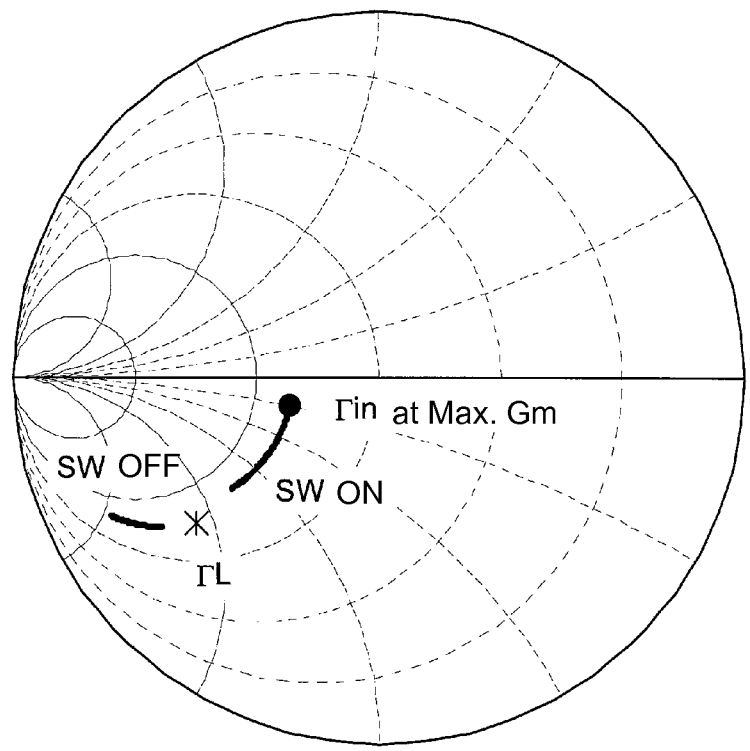
FIGS. 5A and 5B are diagrams showing an operation of the impedance matching circuit of FIG. 3 on the Smith chart.
Figure 5B:
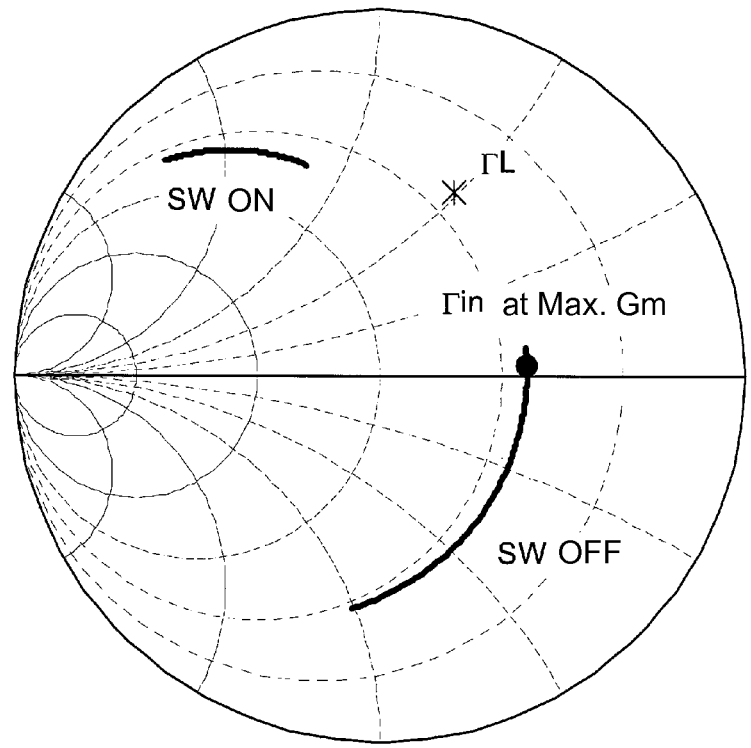
Figure 6A:
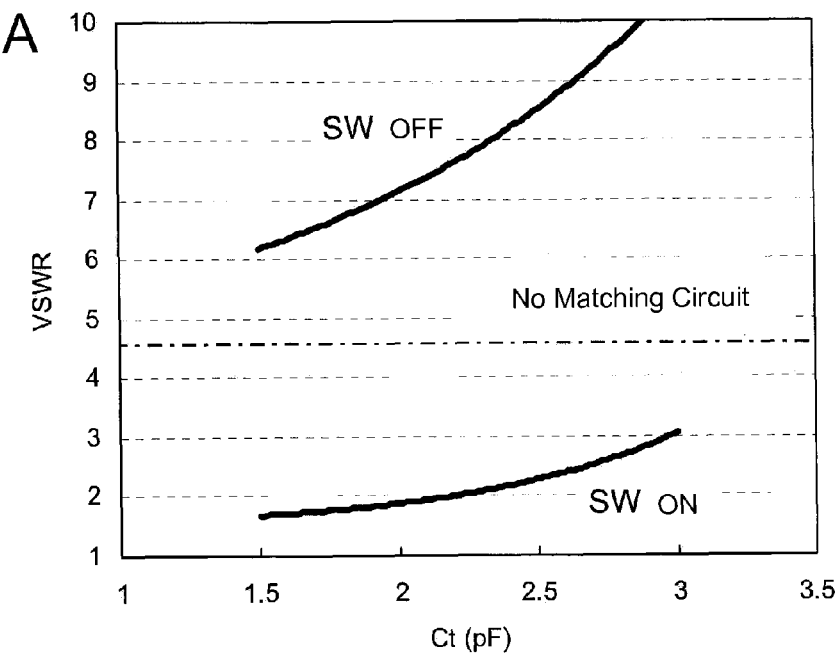
FIGS. 6A and 6B are diagrams showing VSWR characteristics of the impedance matching circuit of FIG. 3.
Figure 6B:
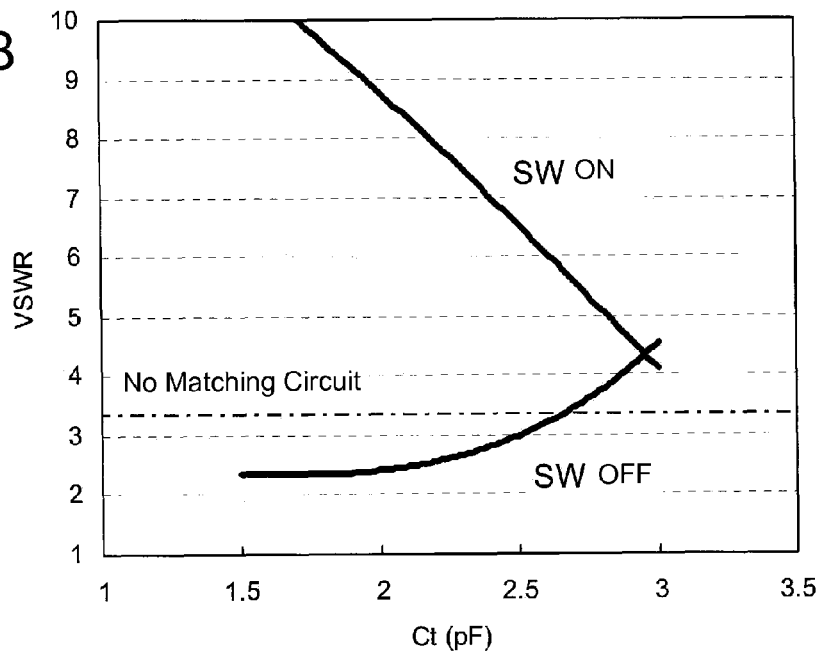
Figure 7A:
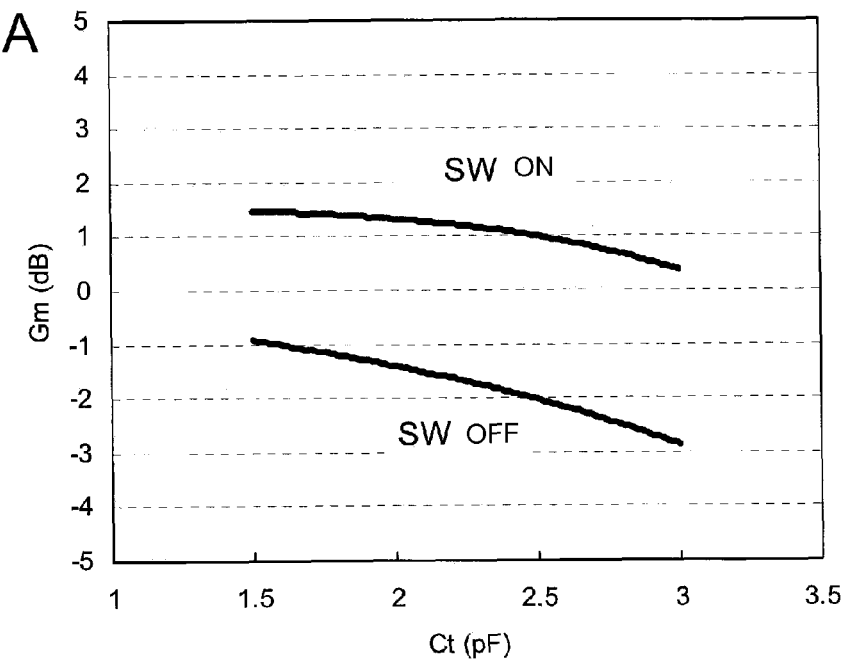
FIGS. 7A and 7B are diagrams showing matching gain characteristics of the impedance matching circuit of FIG. 3.
Figure 7B:
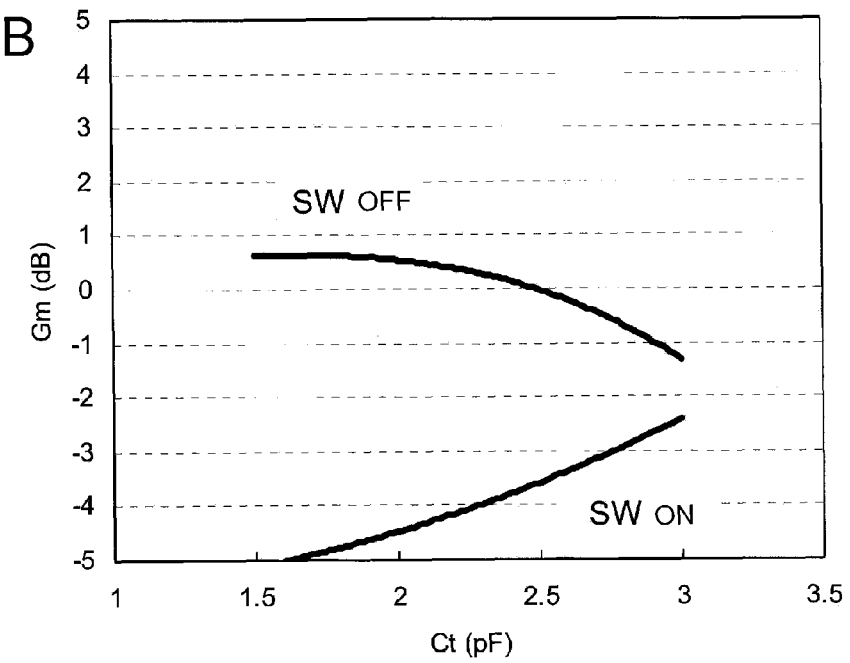

FIGS. 5, 6, and 7 respectively show the reflection coefficient $\Gamma_{in}$, the VSWR characteristics, and the matching gain characteristics for the evaluation circuit 100 after matching. FIGS. 5A to 7A each show a case where a capacitive load $\Gamma_L$=−0.5−j0.4, and FIGS. 5B to 7B each show a case where the inductive load $\Gamma_L$=0.2+j0.5. Here, Gm is matching gain that represents a ratio of transducer gain of when the impedance matching circuit 3 shown in FIG. 1 is connected to a system in which the output impedance is a normalized impedance $Z_0$=50 (Ω), to transducer gain of when the impedance matching circuit 3 is not connected to such a system. Gm can be derived from Formulae 5 to 7 below, using S parameters and the admittance Y of the impedance matching circuit 3.

Formula 5

$$G_m = \frac{|S_{21}|^2}{|1-S_{22}\Gamma_L|} \quad (5)$$

Formula 6

$$S_{21} = \frac{2}{2+Z_0Y} \quad (6)$$

Formula 7

$$S_{22} = \frac{-Z_0Y}{2+Z_0Y} \quad (7)$$

Figure 8A:
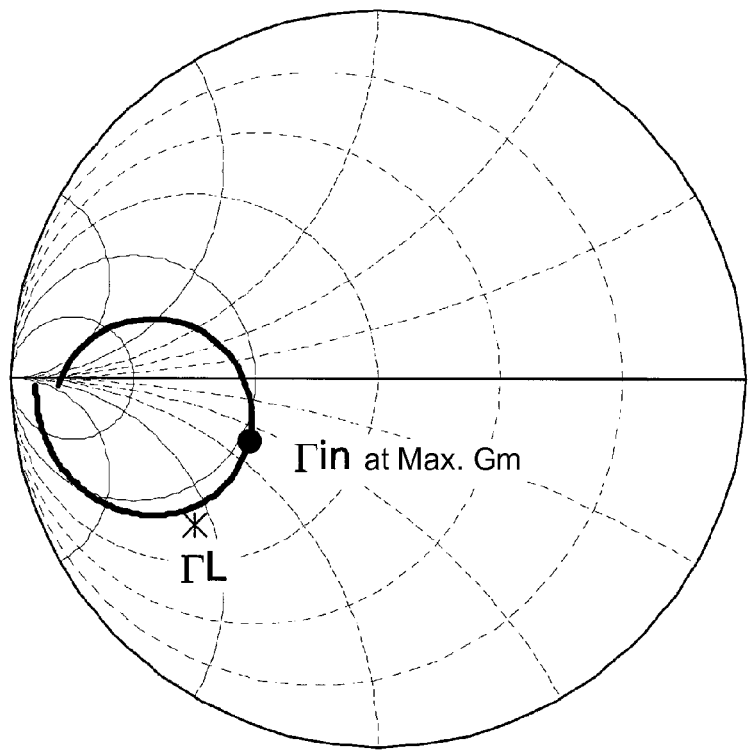
FIGS. 8A and 8B are diagrams showing an operation of the impedance matching circuit of FIG. 4 on the Smith chart.
Figure 8B:
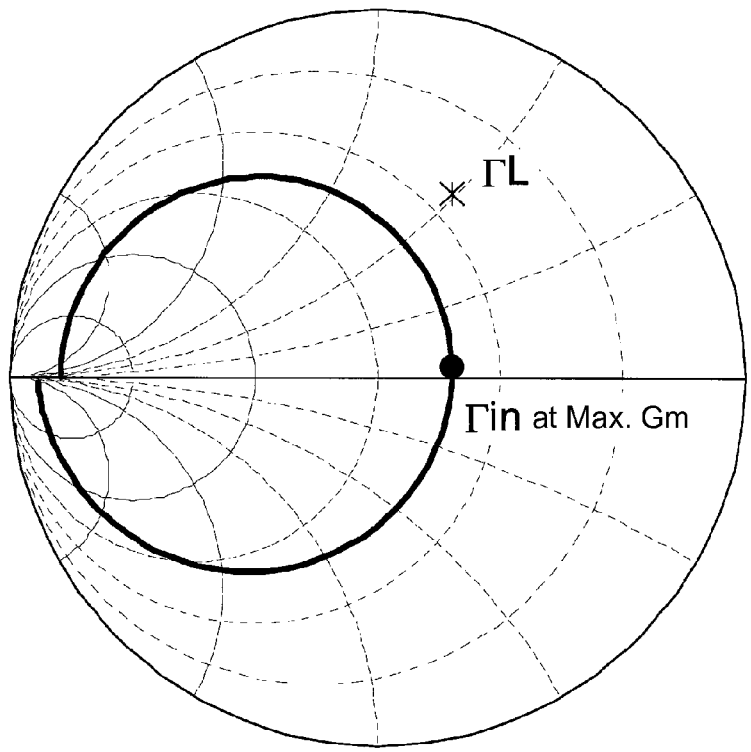
Figure 9A:
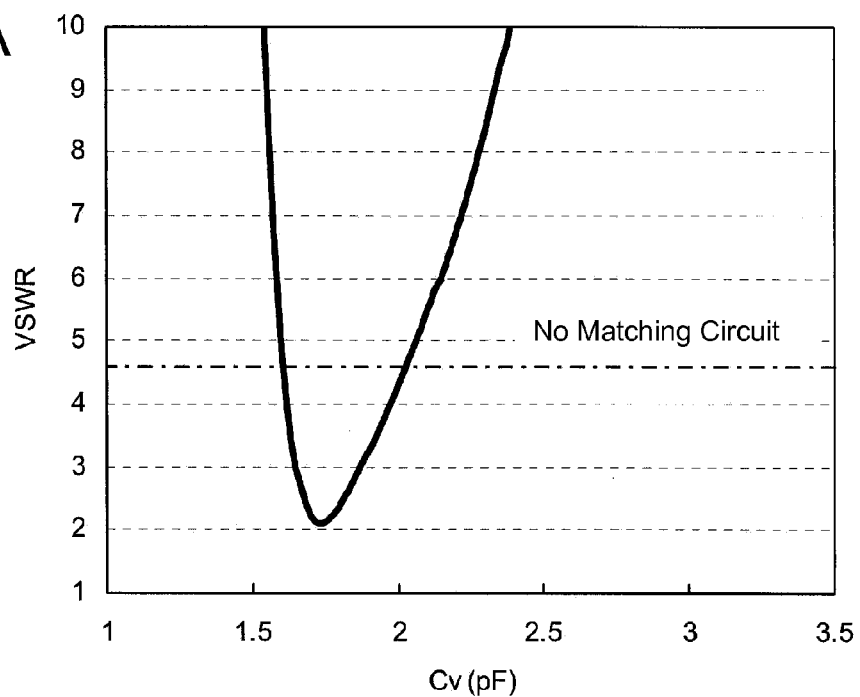
FIGS. 9A and 9B are diagrams showing VSWR characteristics of the impedance matching circuit of FIG. 4.
Figure 9B:
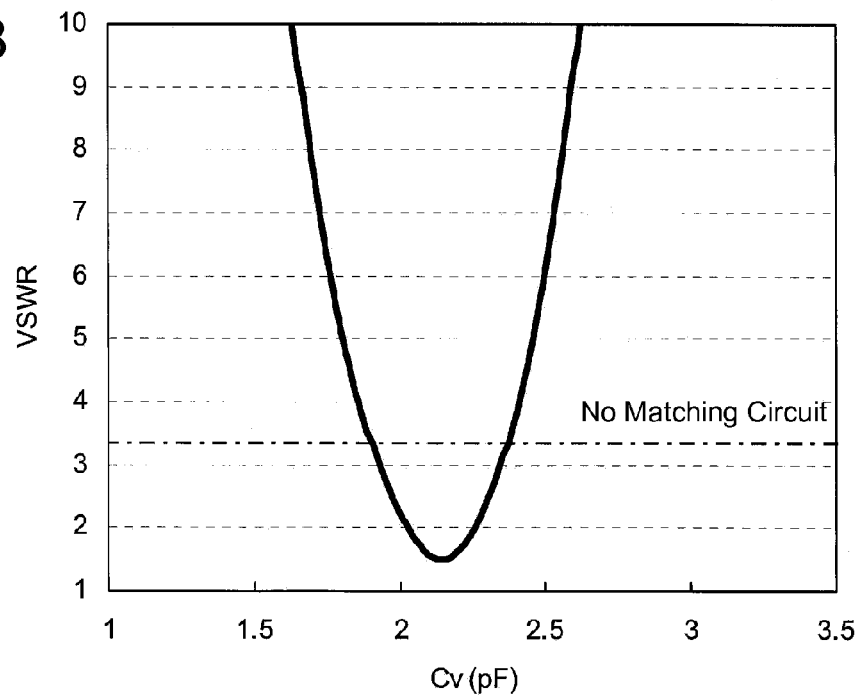
Figure 10A:
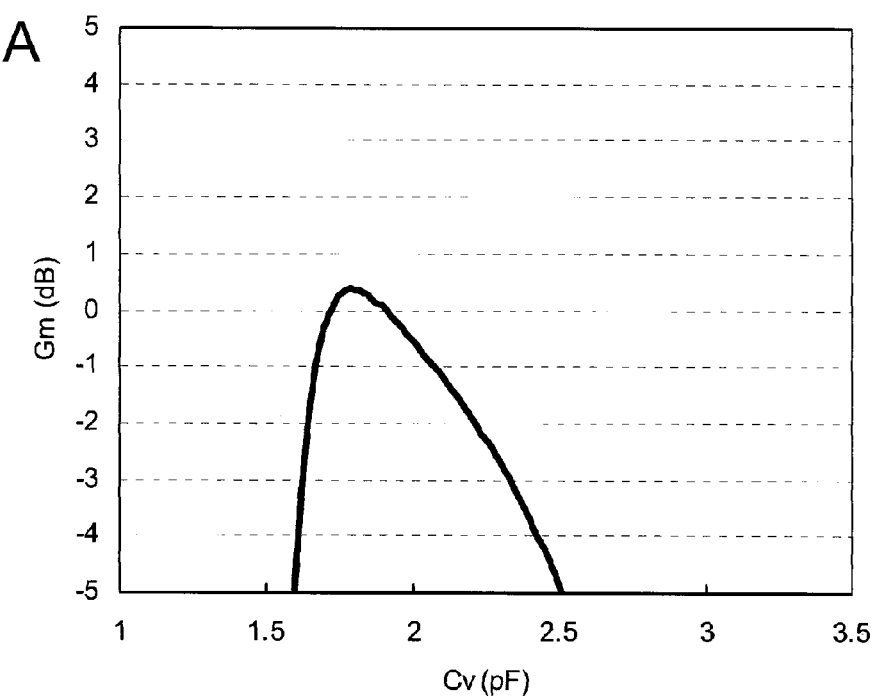
FIGS. 10A and 10B are diagrams showing matching gain characteristics of the impedance matching circuit of FIG. 4.
Figure 10B:
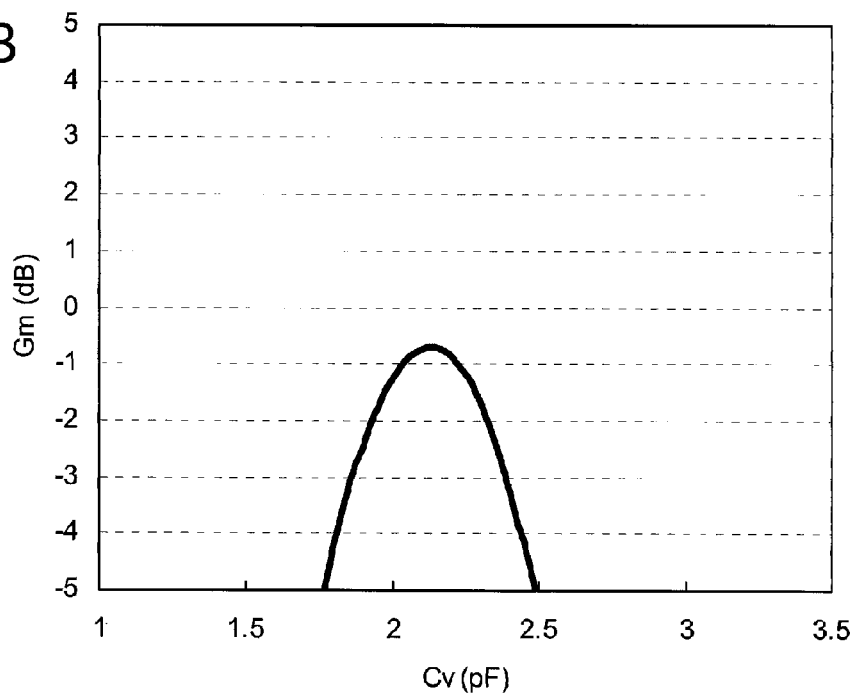

Similarly, FIGS. 8, 9, and 10 respectively show the reflection coefficient $\Gamma_{in}$, VSWR, and the matching gain Gm for the comparison circuit 200 after matching. FIGS. 8A, 9A, and 10A each show a case where a capacitive load $\Gamma_L$=−0.5−j0.4, and FIGS. 8B to 10B each show a case where the inductive load $\Gamma_L$=0.2+j0.5. Although the results are merely one example, VSWR of the system to which the circuit is connected can be improved, and with the evaluation circuit 100, by turning the SW on for the capacitive load, and by turning the SW off for the inductive load, the mismatch loss can be improved as compared with the comparison circuit 200. Also, because Gm and VSWR change gradually with respect to a change in capacitance, it becomes easier to control.

Effects of Embodiments

The impedance matching circuit 3 of the present embodiment is connected to a first circuit block (impedance matching target circuit 2) that requires impedance matching and that has one terminal connected to the signal line 11 and the other terminal connected to the ground 12. The impedance matching circuit 3 includes the second circuit block that has the first circuit and the second circuit connected in parallel. In the first circuit, the first capacitor $C_t$ that has a variable capacitance $C_{t0}$ and the first inductor $L_a$ that has the first inductance $L_{a0}$ are connected in series, and in the second circuit, the second inductor $L_b$ that has the second inductance $L_{b0}$ and the switch SW are connected in series. The impedance matching circuit 3 has one terminal connected to the signal line 11 of the first circuit block and the other terminal connected to the ground 12 of the first circuit block.

With the impedance matching circuit 3 of the present embodiment, by setting the first inductor La such that $1/[\omega(\omega L_{a0}+R_a)]$ is smaller than the maximum capacitance $C_{max}$ of the variable capacitor, where $R_a$ is a sum of the parasitic resistance of the first circuit, or such that $L_{a0}$ is smaller than $(1/(\omega C_{max})-R_a)/\omega$, the significant increase in conductance due to a parasitic resistance can be suppressed. The inductance $L_{a0}$ can be made smaller than $L_1=1/(\omega^2 C_{max})$ of the conventional technology, and because the conductor length in the inductor can also be made shorter, if the inductor has the same Q value, the parasitic capacitance can also be made smaller. The second inductor $L_b$ has a function of making the susceptance shifted to the negative side when the switch SW is off, and the smaller the inductance $L_{b0}$, the more the susceptance can be shifted. Thus, it is possible to change the susceptance region without increasing the conductance.

As shown in the characteristics diagram (FIG. 2), it is possible to prevent an increase in conductance while maintaining a large variable range of the susceptance by turning on and off the switch SW. By using the impedance matching circuit 3, when the impedance matching target circuit is inductive, the switch SW is turned off, so that the capacitance is increased, and when the impedance matching target circuit is capacitive, the switch SW is turned on, so that the capacitance is decreased. As a result, it is possible to provide the impedance matching circuit 3 that can address a wide range of impedance change by using variable capacitors that has a smaller variable ratio while suppressing deterioration in characteristics due to a parasitic resistance.

Embodiment 1

Figure 11:
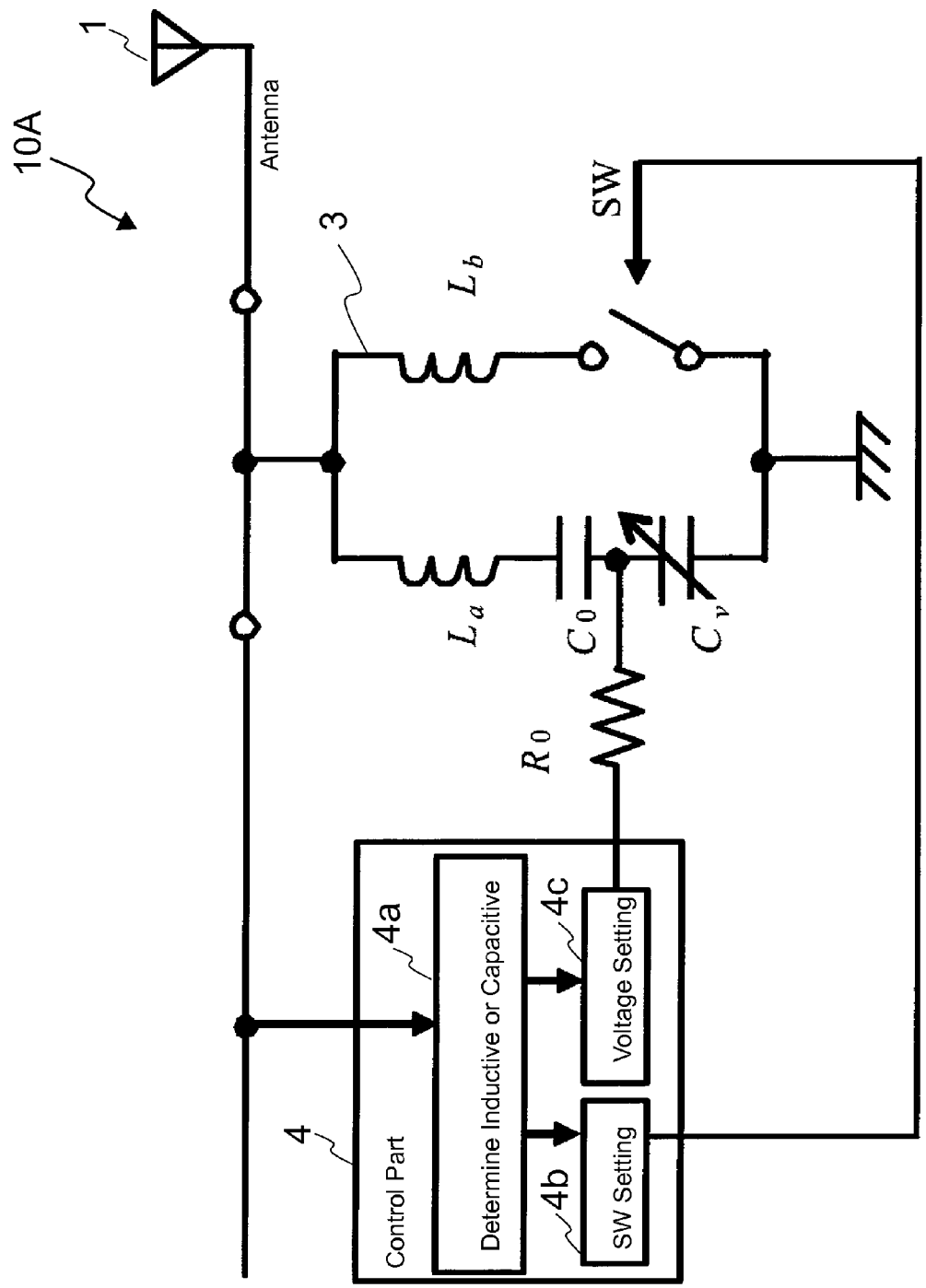
FIG. 11 is a diagram showing a circuit configuration of an impedance matching circuit of Embodiment 1 of the present invention.

Next, with reference to FIG. 11, an antenna system 10A of Embodiment 1 will be explained. In Embodiment 1, the impedance matching circuit 3 shown in FIG. 1 is disposed near an antenna 1, thereby constructing the antenna system 10A. In Embodiment 1, a control part 4 is additionally provided. The control part 4 determines whether input impedance of the antenna 1 and the impedance matching circuit 3 is capacitive or inductive, and controls a voltage that is applied between $L_a$ and $C_t$. The control part 4 controls a voltage of a ferroelectric varactor diode or a variable capacitance diode such that, when the input impedance is capacitive, the switch SW provided in the impedance matching circuit 3 is turned on, so that the capacitance is decreased, and when the input impedance is inductive, the switch SW is turned off, so that the capacitance is increased. This antenna system is configured such that the control circuit does not affect the impedance matching circuit 3. That is, by inserting a capacitor $C_0$ with a capacitance that does not affect the characteristics between the inductor and the variable capacitor, an unwanted current can be prevented from flowing into the impedance matching circuit. Also, by inserting a resistance $R_0$ having a high resistance value between the control part 4 and the first circuit, the signal can be prevented from leaking toward the control circuit.

The control part 4 may be realized as software or hardware, and in either case, the control part 4 includes a function block 4a that determines whether the input impedance is capacitive or inductive, a function block 4b that sets the switch SW based on the result of the function block 4a, and a function block 4c for voltage setting that sets a voltage to be applied to the variable capacitor included in the impedance matching circuit 3.

With this configuration, it is possible to provide the antenna system 10A for a mobile phone wireless module or the like, for example, that can achieve active impedance matching with a simple configuration and low cost, by using the impedance matching circuit 3 of FIG. 1 that is disposed near the antenna 1, and the control part 4 that determines whether the input impedance of the first circuit block (antenna 1 and impedance matching circuit 3) is conductive or inductive and that sets the SW off when the input impedance is inductive and sets the SW on when the input impedance is conductive, the control part also controlling a voltage applied between the first inductor ($L_a$ in the impedance matching circuit 3) and the first variable capacitor ($C_t$ in the impedance matching circuit 3).

Embodiment 2

Figure 12:
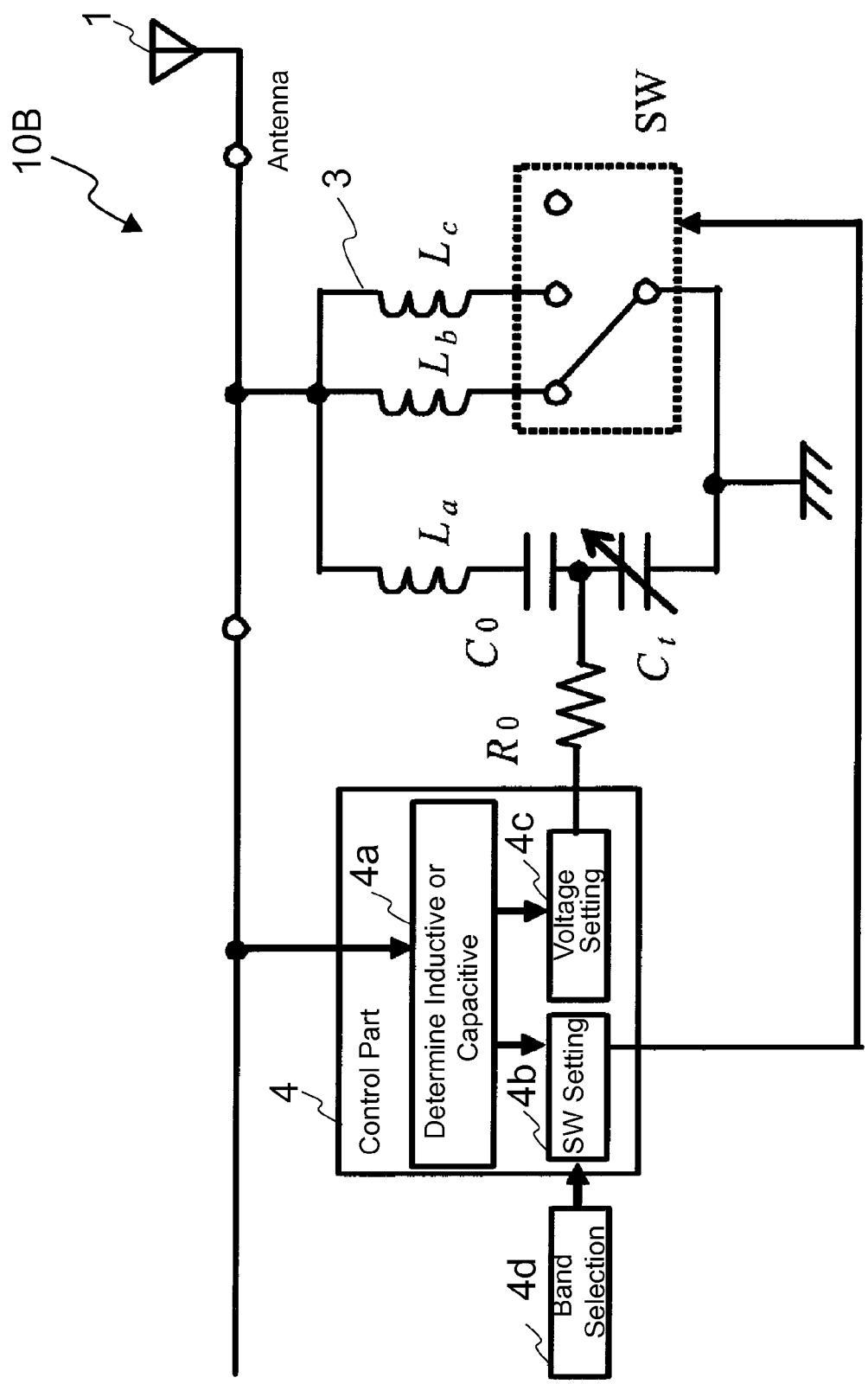
FIG. 12 is a diagram showing a circuit configuration of an impedance matching circuit of Embodiment 2 of the present invention.

With reference to FIG. 12, an antenna system 10B of Embodiment 2 will be explained. The configuration of FIG. 12 differs from Embodiment 1 shown in FIG. 11 in that inductors $L_b$ and $L_a$ are connected in parallel in the impedance matching circuit 3, and are switched from one to the other by the switch SW. Also, the control part 4 is provided with a function block 4d through which a band selection can be made from the outside.

With this configuration, by connecting, to the second inductor ($L_b$) in parallel, the third inductor ($L_a$) that has a different inductance from that of the second inductor, and by changing an inductor connected to the first circuit block (antenna 1) from one of the second and third inductors ($L_b$ and $L_a$) to the other through the switch SW based on the band selection, it is possible to address two frequency bands. Furthermore, by increasing the number of inductors connected in parallel, it becomes possible to address a greater number of frequency bands. Thus, according to Embodiment 2, it is possible to configure the antenna system 10B that can achieve the effects of Embodiment 1 shown in FIG. 11 and that additionally has flexibility and scalability.

Preferred embodiments of the present invention have been described above, but it will be apparent that the technical scope of the present invention is not limited to the scope described in the embodiments above. It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An impedance matching circuit for connection to a first circuit block that requires impedance matching, the first circuit block configured to have one terminal connected to a signal line and another terminal connected to a ground, the impedance matching circuit comprising:
    a second circuit block having a first circuit and a second circuit connected in parallel, the first circuit including a first capacitor having a variable capacitance and a first inductor having a first fixed inductance connected in series, the second circuit including a second inductor having a second fixed inductance and a switch connected in series,
    wherein one terminal of the impedance matching circuit is to be connected to the signal line of the first circuit block, and another terminal of the impedance matching circuit is to be connected to the ground of the first circuit block,
    wherein the first and second circuits of the second circuit block do not contain any radiation electrodes,
    wherein the first circuit is to be connected to the signal line without passing through the switch in the second circuit,
    wherein no series matching circuit is provided between the first circuit and the second circuit,
    wherein the first fixed inductance $L_{a0}$ of the first inductor is set to be smaller than $(1/(\omega C_{max})-R_a)/\omega$, where $C_{max}$ is a maximum capacitance of said variable capacitor, and $R_a$ is a sum of a parasitic resistance value of the first inductor $L_a$ and a parasitic resistance value of the variable capacitor in the first circuit, and
    wherein the second fixed inductance $L_{b0}$ is set such that when the switch is on and off, a susceptance of the impedance matching circuit varies in a prescribed range as the variable capacitance of the variable capacitor changes from a minimum capacitance to the maximum capacitance $C_{max}$.

2. The impedance matching circuit according to claim 1, further comprising a control part that determines whether an input impedance of the first circuit block is inductive or capacitive and that turns the switch off when the input impedance is inductive and turns the switch on when the input impedance is capacitive, the control part controlling a voltage to be applied between the first inductor and the first capacitor.

3. The impedance matching circuit according to claim 2, further comprising a third inductor that has a different inductance from that of the second inductor, the third inductor being connected to the second inductor in parallel,
    wherein the control part controls the switch to change an inductor to be connected to the first circuit from one of the second inductor and the third inductor to another.

4. An antenna system, comprising:

an antenna;

an impedance matching circuit disposed near the antenna and connected between a signal line and a ground of the antenna, the impedance matching circuit having a first circuit and a second circuit connected in parallel, the first circuit including a first capacitor having a variable capacitance and a first inductor having a first fixed inductance connected in series, the second circuit including a second inductor having a second fixed inductance and a switch connected in series; and a control part that determines whether an input impedance of the antenna is inductive or capacitive and that turns the switch off when the input impedance is inductive and turns the switch on when the input impedance is capacitive, the control part controlling a voltage applied between the first inductor and the first capacitor, wherein the first and second circuits of the impedance matching circuit do not contain any radiation electrodes, wherein the first circuit is connected to the signal line without passing through the switch in the second circuit, wherein no series matching circuit is provided between the first circuit and the second circuit, wherein the first fixed inductance $L_{a0}$ of the first inductor is set to be smaller than $(1/(\omega C_{max})-R_a)/\omega$, where $C_{max}$ is a maximum capacitance of said variable capacitor, and $R_a$ is a sum of a parasitic resistance value of the first inductor $L_a$ and a parasitic resistance value of the variable capacitor in the first circuit, and wherein the second fixed inductance $L_{b0}$ is set such that when the switch is on and off, a susceptance of the impedance matching circuit varies in a prescribed range as the variable capacitance of the variable capacitor changes from a minimum capacitance to the maximum capacitance $C_{max}$.

5. The antenna system according to claim 4, further comprising a third inductor that has a different inductance from that of the second inductor, the third inductor being connected to the second inductor in parallel, wherein the control part controls the switch to change an inductor to be connected to the first circuit from one of the second inductor and the third inductor to another.

* * * * *